United States Patent
Dick et al.

(10) Patent No.: US 9,455,760 B1
(45) Date of Patent: Sep. 27, 2016

(54) WAVEFORM ADAPTABLE DIGITAL PREDISTORTION

(71) Applicant: Xilinx, Inc., San Jose, CA (US)

(72) Inventors: Christopher H. Dick, San Jose, CA (US); Hemang M. Parekh, San Jose, CA (US); Hongzhi Zhao, Los Gatos, CA (US); Vincent C. Barnes, El Paso, TX (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/791,096

(22) Filed: Jul. 2, 2015

(51) Int. Cl.
*H04B 1/04* (2006.01)
*H04B 1/62* (2006.01)

(52) U.S. Cl.
CPC .............. *H04B 1/62* (2013.01); *H04B 1/0475* (2013.01); *H04B 2001/0425* (2013.01)

(58) Field of Classification Search
CPC ........ H04B 1/04; H04B 1/0475; H04B 1/64; H04B 2001/0408; H04B 2001/0416; H04B 2001/0425; H04B 2001/0433; H04B 1/62
USPC .......................... 375/260, 296, 297; 381/94.1; 455/67.13, 114.2, 114.3
See application file for complete search history.

(56) References Cited

U.S. PATENT DOCUMENTS

| | | | | |
|---|---|---|---|---|
| 5,732,333 A * | 3/1998 | Cox | ........................ | H03C 3/406 330/149 |
| 8,706,062 B1 * | 4/2014 | Yu | ........................ | H03F 1/3223 455/126 |
| 9,008,156 B1 | 4/2015 | Dick | | |
| 2004/0232985 A1 * | 11/2004 | Itahara | ................... | H03F 1/3247 330/149 |
| 2004/0246048 A1 * | 12/2004 | Leyonhjelm | .......... | H03F 1/3247 330/2 |
| 2005/0180526 A1 | 8/2005 | Kim et al. | | |
| 2006/0262880 A1 * | 11/2006 | Mizuta | .................. | H03F 1/3258 375/297 |
| 2010/0220810 A1 * | 9/2010 | Jin | ......................... | H04L 27/368 375/296 |
| 2012/0154038 A1 | 6/2012 | Kim et al. | | |
| 2013/0321078 A1 * | 12/2013 | Ishikawa | ............... | H03F 1/3247 330/149 |
| 2015/0214987 A1 * | 7/2015 | Yu | ........................ | H04B 1/0475 375/297 |

FOREIGN PATENT DOCUMENTS

EP  2530832  12/2012

* cited by examiner

*Primary Examiner* — Young T Tse

(74) *Attorney, Agent, or Firm* — W. Eric Webostad

(57) ABSTRACT

Apparatus, method therefor, generally related to signal preconditioning. In such an apparatus, a signal classifier block and a delay block are commonly coupled for receiving an input signal. The delay block is for providing a delayed version of the input signal. The signal classifier block is for classifying the input signal and generating a configuration signal having configuration information for digital predistortion ("DPD") engine parameterization in response to the input signal classification. A DPD engine is for receiving the delayed version of the input signal and the configuration signal and for providing a predistorted output signal.

20 Claims, 8 Drawing Sheets

WAVEFORM ADAPTABLE DIGITAL PREDISTORTION

TECHNICAL FIELD

The following description relates to integrated circuit devices ("ICs"). More particularly, the following description relates to waveform adaptable digital predistortion for an IC.

BACKGROUND

Digital predistortion ("DPD") is used in wireless or cellular basestations. DPD may be used, for example, in remote radio units ("RRU") to improve efficiency in a power amplifier and/or to reduce spectral regrowth associated with nonlinearities in an RF chain. DPD may thus be used to ensure spectral regrowth does not violate spectral emission masks or interfere with communications of a neighboring spectrum. A provider of an integrated circuit chip may face challenges in terms of differences in input signals for providing DPD for a variety of different waveforms.

Accordingly, it would be desirable and useful to provide a DPD system capable of managing signal dynamics for any of a variety of different input waveforms to be predistorted.

SUMMARY

An apparatus relates generally to signal preconditioning. In such an apparatus, a signal classifier block and a delay block are commonly coupled for receiving an input signal. The delay block is for providing a delayed version of the input signal. The signal classifier block is for classifying the input signal and generating a configuration signal having configuration information for digital predistortion ("DPD") engine parameterization in response to the input signal classification. A DPD engine is for receiving the delayed version of the input signal and the configuration signal and for providing a predistorted output signal.

A method relates generally to signal preconditioning. In such a method, an input signal is received by a signal classifier block and a delay block. The input signal is delayed by the delay block for providing a delayed version thereof. The input signal is classified with the signal classifier block. A configuration signal is generated by the signal classifier block. The configuration signal is generated to include configuration information for digital predistortion ("DPD") engine parameterization in response to the input signal classification. The delayed version of the input signal and the configuration signal is received by a DPD engine. The input signal is predistorted by the DPD engine for providing a predistorted output signal.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 3-1 is a block diagram depicting an exemplary digital predistortion ("DPD") engine.

FIG. 3-2 is a block diagram depicting another exemplary DPD engine.

DETAILED DESCRIPTION

Figure 1:
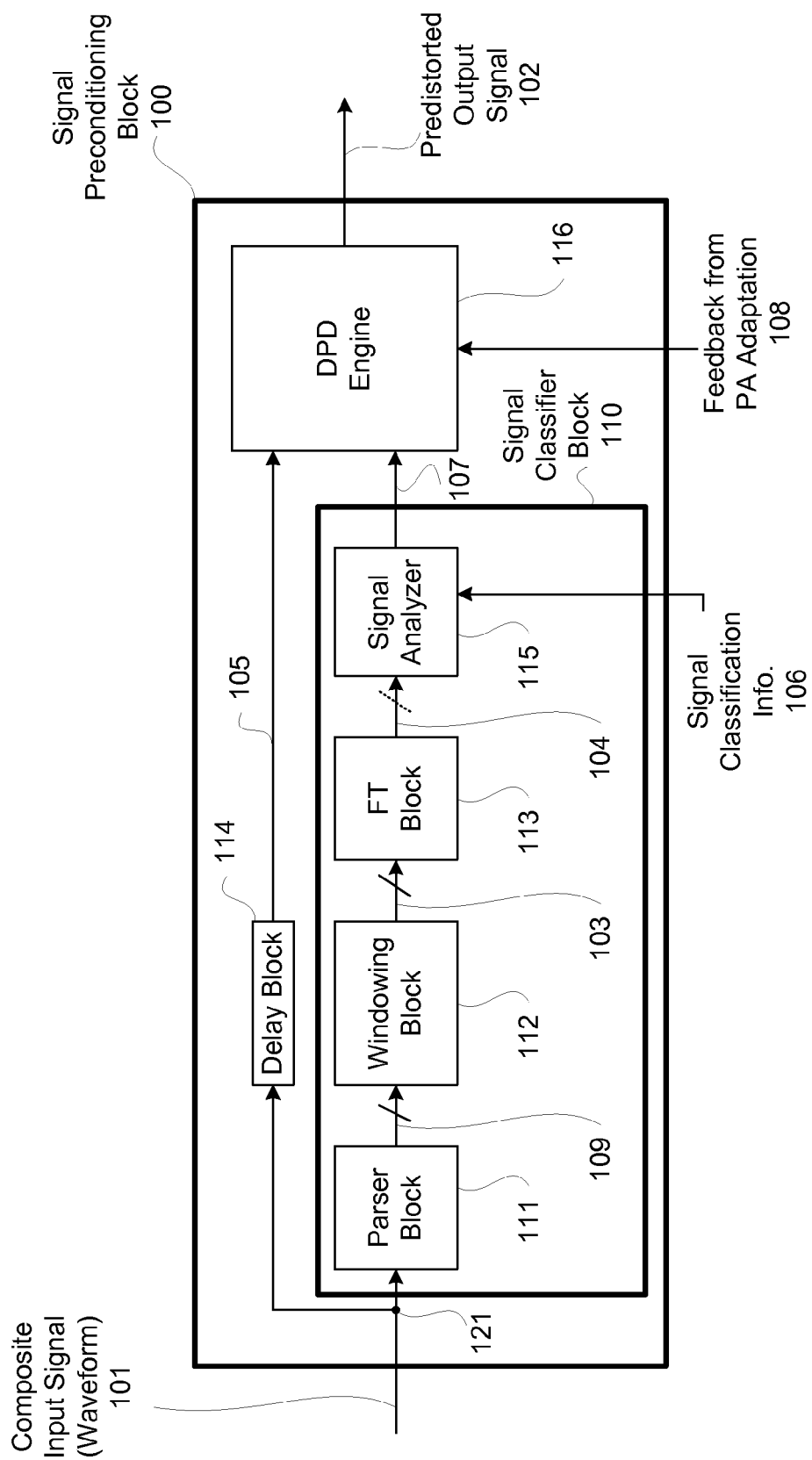
FIG. 1 is a block diagram depicting an exemplary signal preconditioning block.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Linearization performance, as measured for example in terms of power added efficiency and improvement in adjacent channel power ratio ("ACPR"), may be a function of a signal processing chain and/or output power level. Such linearization performance may be tightly coupled to characteristics of a power amplifier used. Consider an example involving three 20 MHz LTE carriers. These three LTE20 signals may be shaped, up-sampled and mixed to form a multi-carrier frequency-division multiplexed composite waveform. This waveform signal may be delivered to a DAC, an RF chain and then a power amplifier. Each LTE20 signal may be carrying independent data. A variance in sub-carrier loading in an OFDM symbol may result in power variations for a carrier thereof.

In order to enhance linearization performance, a reduction in adjacent channel leakage may be useful. For such a reduction, a DPD system, such as described below, may modify its behavior in response to these power variations, namely by managing signal dynamics.

In some deployments of a DPD system, access to individual carriers may not be available, or may not be conveniently accessible. For example, a partition may exist such that a composite input signal is assembled in one part of a basestation and delivered over an optical fiber or coaxial cable or other medium to a remote unit of such basestation, where such remote unit contains a DPD system, RF electronics, and a power amplifier. In another example, a DPD system may be encapsulated in one module in a processing chain, namely a DPD subsystem therein, so a radio-shelf designer is not encumbered with additional complexity of inserting circuits that are going to forward side-channel information to a DPD processing unit.

As described below in additional detail, side information is provided to a DPD engine to transform such DPD engine from a general-purpose DPD engine to a special-purpose DPD engine for an input signal according to modulation type, bandwidth, and/or power level. This side or side-channel information is provided within a signal preconditioning block including a DPD system. Accordingly, within a transmission system, effectiveness of converting input DC power to RF energy by a power amplifier, such as in a wireless basestation, may be enhanced by managing signal dynamics by a DPD system using such side information. Enhanced predistortion resulting in enhanced efficiency, including without limitation linearization, of a power amplifier may have positive implications for CAPEX, OPEX, reducing physical size, and/or increasing coverage of a basestation radio. Such composite input signal may be a multi-carrier or multi-RAT ("Radio Access Technology") signal, for which spectral processing as described herein may be locally used within a DPD system for analyzing such composite waveform to derive parameters therefrom to adapt behavior of a DPD system to such composite waveform.

With the above general understanding borne in mind, various configurations for signal preconditioning with managed signal dynamics for DPD are generally described below.

FIG. 1 is a block diagram depicting an exemplary signal preconditioning block 100. Signal preconditioning block 100 includes a signal classifier block 110, a delay block 114, and a digital predistortion ("DPD") engine 116. Signal classifier block 110 includes a parser block 111, a windowing block 112, a Fourier Transform block 113, and a signal analyzer 115. Signal classifier block 110 and delay block 114 may be commonly coupled at an input node 121 of signal preconditioning block 100 for receiving an input signal 101. Signal preconditioning block 100 may be thought of as a DPD system with managed signal dynamics to accommodate any of a variety of different composite input signals.

Delay block 114 may provide a delayed version 105 of input signal 101 to DPD engine 116. Signal classifier block 110 may provide a configuration signal 107 identifying classification of input signal 101 to DPD engine 116. DPD engine 116 may receive a delayed version 105 of input signal 101, a feedback signal 108 and a configuration signal 107 in order to provide a predistorted version of input signal 101 as a predistorted output signal 102 from signal preconditioning block 100.

Signal classifier block 110 may include a parser block 111 to receive an input signal 101 to provide data blocks 109 from complex data samples obtained from input signal 101. Parser block 111 may be configured to read in a number of bits from a serial bitstream, such as 1024 bits or some other number of bits, for output of such number of bits as a data block. Parser block 111 may be a buffer for buffering data of input signal 101 for respectively outputting data blocks 109. Accordingly, parser block 111 may include solid-state memory or other storage.

Data blocks 109 may be non-overlapping or overlapping data blocks 109. For an implementation of parser 111 with non-overlapping data blocks 109, blocks or other groupings of complex data samples obtained from input signal 101 do not have any same bits between them, namely such data blocks 109 are end-to-end segments of input signal 101. Accordingly, parser 111 may be configured to output all bits stored therein on each read.

However, in an implementation for averaging of an input signal 101 as sampled by parser 111 for subsequent input for spectrum analysis, parser 111 may be configured to output overlapping data blocks 109. For example, parser 111 may be configured to retain on a read cycle an initial number of bits of a current data block 109 being output as the same bits as a last number of bits of an immediately following data block 109 being written into parser 111. Thus, effectively overlapping data blocks do have some same bits between them, namely such data blocks 109 are bit linked segments of input signal 101.

A windowing block 112 may receive each data block 109 of data blocks 109 output from parser block 111. Windowing block 112 may provide a set of windowed samples 103 of sets of windowed samples 103 for each data block 109 of data blocks 109. Accordingly, each data block 109 may be processed one at a time from a digital input signal 101, where data blocks 109 may be obtained from such an input signal 101 associated with data communication, namely for subsequent transmission of such data.

Windowing block 112 may provide a window function for tapering of ends of each of data blocks 109. Such a window function may be a generalized Hamming window function selected from a group consisting of a Hamming window and a Hann window. For such a window function which is a higher order generalized cosine window function, such a window function may be selected from a group consisting of a Kaiser window, a Kaiser-Bessel derived window, a Blackman window, a Nuttall window, a Blackmun-Nuttall window, a Blackmun-Harris window, and a Rife-Vincent window. These are just some known examples of window functions that may be used, and these or other window functions may be used as may vary from application-to-application.

A Fourier Transform ("FT") block 113 may receive sets of windowed samples 103 to provide spectral information 104 for each set of windowed samples 103. Fourier Transform block 113 may be for a Discrete Fourier Transform for converting each set of windowed samples 103 from a time domain to a frequency domain to provide spectral information 104 for such sets of digital complex samples. Along those lines, Fourier Transform block 113 may be configured to perform a Fast Fourier Transform ("FFT").

Fourier Transform block 113 may be configured for receiving multiple digital sample inputs or points at a time for outputting multiple corresponding spectral outputs at a time as spectral information 104 for throughput. Accordingly, spectral information 104 may be provided in a parallel to signal analyzer 115 for an entire set of window samples 103. However, for a lower throughput implementation, Fourier Transform block 113 may be configured to read each sample one at a time from a set of windowed samples 103 to output a corresponding spectral output for spectral information 104. Accordingly, for a lower throughput implementation, spectral information 104 may be provided serially to signal analyzer 115 for each data sample in a set of windowed samples 103.

A signal analyzer 115 may receive spectral information 104 and signal classification information 106 to provide configuration signal 107. Signal classification information 106 may include meta-data for a plurality of different waveforms. Such meta-data may include frequency bandwidth information, modulation information, and/or power-level information for a plurality of different signal types for a plurality of different waveforms.

Examples of some signal types may include one or more forms of WCDMA signals, LTE signals, GSM signals, CDMA200 signals, and/or other types of wireless or cellular communication signals. Such meta-data may be used to effectively identify which "bin" an input signal falls into. For example, a signal with an OFDM form of modulation with any of a 1.4 MHz, 3 MHz, 5 MHz, 10 MHz, 15 MHz, or 20 MHz bandwidth may be classified as a 4G LTE signal, and a signal with a CDMA form of modulation with a 5 MHz bandwidth may be classified as a WCDMA signal. Signal analyzer 115 may be implemented with a device selected from a group consisting of a processor-core IC, a DSP, an ASSP, an ASIC, or an FPGA for example. Thus, signal analyzer 115 may be implemented with a processor core and/or logic gates for example to identify signal composition of input signal 101 from such spectral information 104 therefor in view of signal classification information 106.

Signal analyzer 115 may identify a signal type of input signal 101 using spectral information 104 and a priori information on a suite of permissible waveforms that might be present in input signal 101 as informed by signal classification information 106. Signal analyzer 115 may measure power of each component carrier in input signal 101, namely for a single or multi-band input signal 101.

Figure 2:
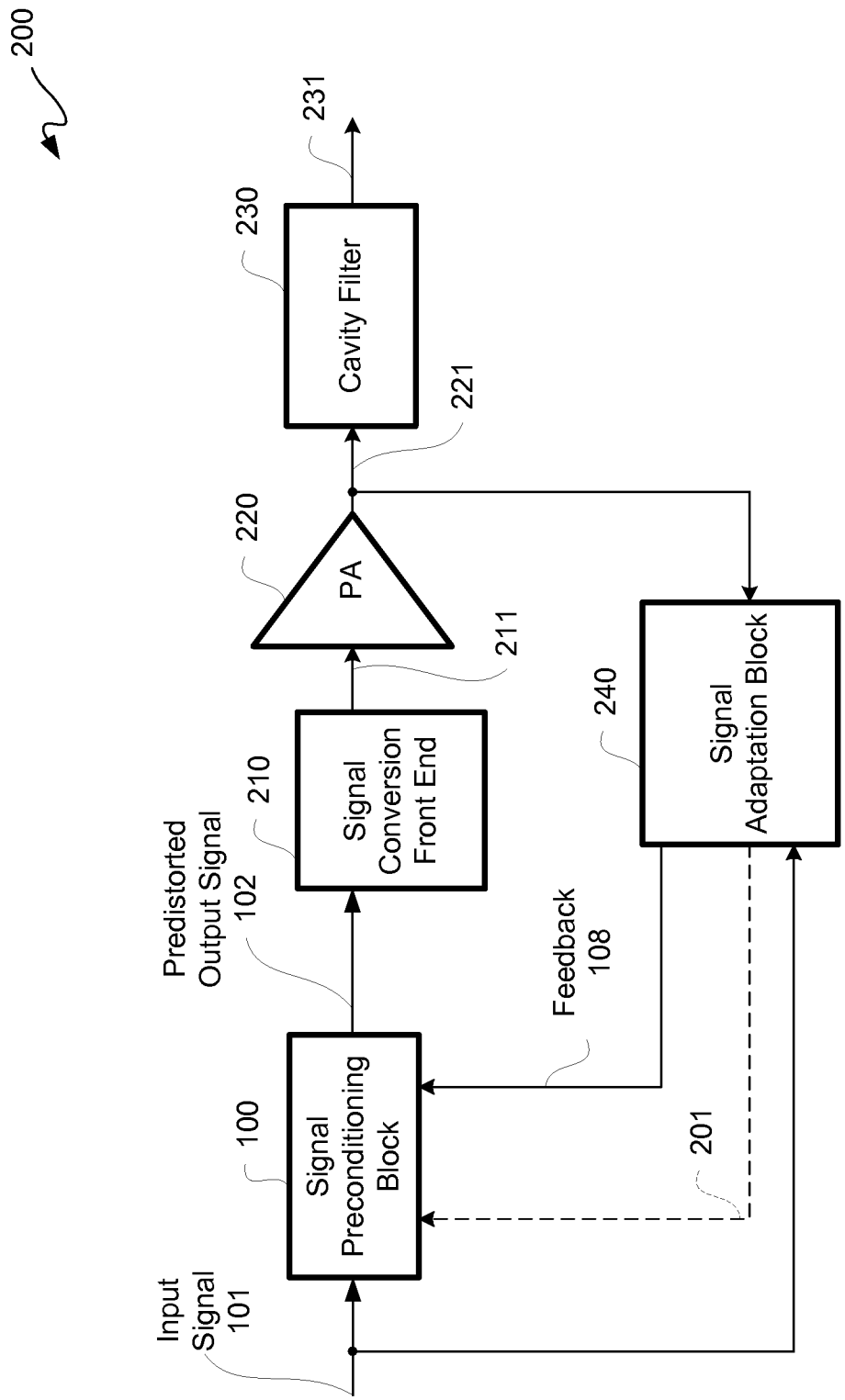
FIG. 2 is a block diagram depicting an exemplary transmission system for data transmission.

Signal preconditioning block 100 may be used for preconditioning a signal for subsequent transmission in a system therefor. Along those lines, FIG. 2 is a block diagram depicting an exemplary transmission system 200 for data transmission. Transmission system 200 includes a signal preconditioning block 100 for receiving an input signal 101 for providing a predistorted output signal 102, where output signal 102 is a digitally predistorted version of input signal 101.

Transmission system 200 includes: a signal conversion front end 210 for receiving output signal 102 for providing an analog signal 211; a power amplifier 220 for receiving analog signal 211 for amplifying for providing an analog power amplifier output 221; a cavity filter 230 for receiving power amplifier output 221 for providing a filtered signal 231; and a signal adaptation block 240 for receiving power amplifier output 221 and input signal 101 for providing a feedback signal 108.

Optionally, signal adaptation block 240 may be configured to provide, and signal preconditioning block 100 may be configured to receive, another feedback signal 201. However, for purposes of clarity by way of example and not limitation, it shall be assumed that signal adaptation block 240 only provides a conventional feedback signal 108 to signal preconditioning block 100. Transmission system 200 is further described with simultaneous reference to FIGS. 1 and 2.

Signal conversion front end 210 between signal preconditioning block 100 and PA 220 may be conventional. Along those lines, signal conversion front end 210 may include a digital-to-analog converter ("D/A") for converting a digital predistorted output signal 102 to an analog signal. Signal conversion front end 210 may include an RF mixer and an RF modulator, as well as other known components. Accordingly, signal conversion front end 210 is not described in unnecessary detail herein for purposes of clarity and not limitation.

Analog signal 211 output from signal conversion front end 210 for input to PA 220 may be a DC input which is converted to RF energy to provide an amplified signal as power amplifier output 221. Cavity filter 230 may filter power amplifier output 221 to provide a cavity filtered signal ("filtered signal") 231 for subsequent transmission. Power amplifier output 221 may be fed back to signal adaptation block 240 and input signal 101 associated therewith may be fed forward to signal adaptation block 240 for comparison with power amplifier output 221 for providing feedback signal 108. Signal adaptation block 240 may include a parameter estimator configured for providing a feedback signal 108 for updating predistortion coefficients used by a filter of DPD engine 116. Feedback signal 108 may have predistortion coefficient adaptation information associated with power amplifier output 221, or more particularly with operation of power amplifier 220.

In contrast to a conventional DPD where an input signal 101 is provided to a DPD engine without pre-signal analysis, configuration signal 107 output from signal analyzer 115 may include configuration information regarding an identified signal type for input signal 101. This additional information may be used by DPD engine 116 to improve functioning of a downstream power amplifier 220, namely to reduce effects of nonlinearity of a downstream power amplifier 220. Along those lines, DPD engine 116 may output a predistorted output signal 102 which is configured to more accurately mitigate nonlinearity effects of a downstream power amplifier 220 for improved transmission by a wireless transmitter.

For example, predistorted output signal 102 may more completely address nonlinearity effects of a downstream power amplifier 220 in a wireless system by use of configuration signal 107 and feedback signal 108 by DPD engine 116 for predistorting a delayed version of an input signal 101. Along those lines, meta-data for an input signal 101 used in providing configuration information to DPD engine 116 may enhance operation of a downstream power amplifier 220 beyond conventional predistortion. This improved functioning of a power amplifier 220 may be provided by tailoring such predistortion to such configuration information, or more particularly by using meta-data for an input signal 101 to tailor configuration information for pre-compensating for nonlinearity of such power amplifier 220. Use of both of signals 107 and 108 by DPD engine 116 is to be contrasted with a conventional predistortion path, which does not include a configuration signal 107 as described herein.

Figures 1, 3:
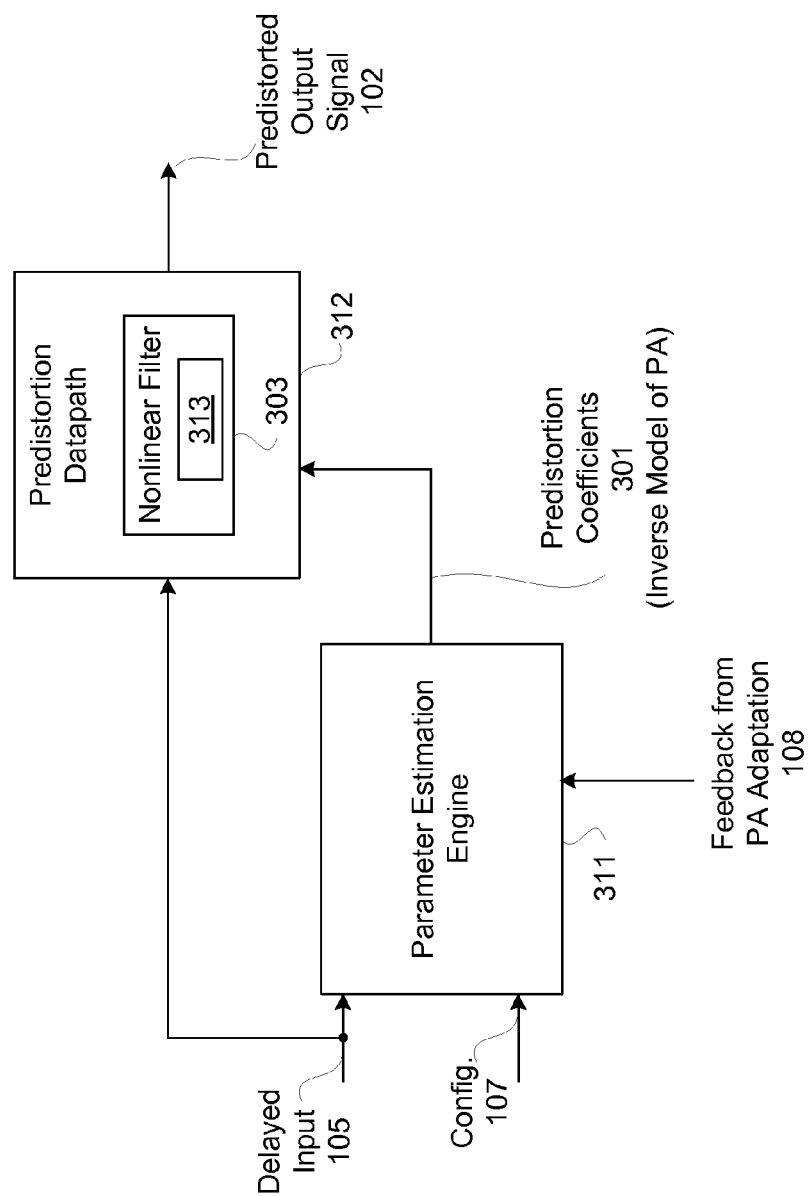
Figures 2, 3:
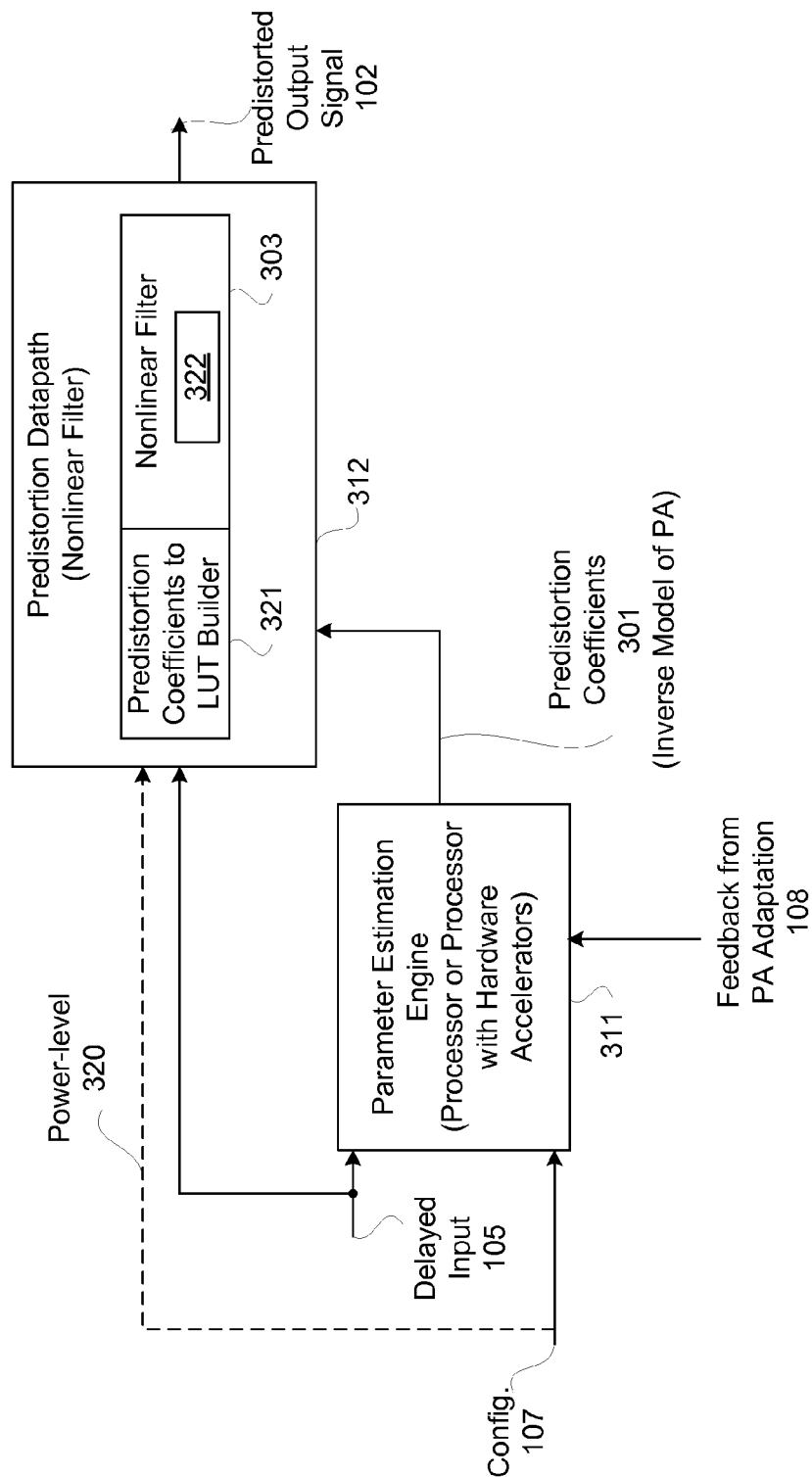

FIG. 3-1 is a block diagram depicting an exemplary DPD engine 116. Transmission system 200, including signal preconditioning block 100, is further described with simultaneous reference to FIGS. 1 through 3-1.

Configuration signal 107 output from signal analyzer 115 of signal classifier block 110 may include configuration information for an identified signal type for input signal 101 for converting a parameter estimation engine 311 of DPD engine 116 into a special-purpose parameter estimation engine 311 for such signal type identified. By loading configuration information in configuration signal 107, parameter estimation engine 311 may be converted into a special-purpose parameter estimation engine 311 for a signal type identified by signal analyzer 115. In other words, parameters estimated by such parameter estimation engine 311 may be tuned to such signal type due to configuration of parameter estimation engine 311 for such signal type in particular.

DPD engine 116 may include a parameter estimation engine 311 and a predistortion datapath block 312. Parameter estimation engine 311 may receive delayed version 105 of input signal 101, configuration signal 107, and feedback signal 108 to provide predistortion coefficients 301 to predistortion datapath block 312.

Predistortion datapath block 312 may receive delayed version 105 of input signal 101 and predistortion coefficients 301. Predistortion datapath block 312 may include a nonlinear filter 303. Direct polynomial evaluation may be used to realize such nonlinear filter 303. Along those lines, predistortion coefficients 301 may be coupled to nonlinear filter 303 as respective filter coefficients thereof. Application of predistortion coefficients 301 may be a direct swapping of filter coefficients, and so direct polynomial evaluation may include a register file 313 for receiving predistortion coefficients 301 for respective output to multipliers of nonlinear filter 303. Nonlinear filter 303 may receive delayed version 105 of input signal 101 for nonlinear filter 303 thereof using such predistortion coefficients 301.

FIG. 3-2 is a block diagram depicting another exemplary DPD engine 116. DPD engine 116 may include a parameter estimation engine 311 and a predistortion datapath block 312. Parameter estimation engine 311 may receive delayed version 105 of input signal 101, configuration signal 107, and feedback signal 108 to provide predistortion coefficients 301 to predistortion datapath block 312.

Configuration signal 107 may include configuration information regarding an identified signal type for input signal 101. By loading configuration information in configuration signal 107, parameter estimation engine 311 may be converted into a special-purpose parameter estimation engine 311 for a signal type identified by signal analyzer 115.

Predistortion datapath block 312 may receive delayed version 105 of input signal 101 and predistortion coefficients 301. Optionally, a power-level signal 320 may be branched off from configuration signal 107 to indicate a power-level associated with predistortion coefficients 301. However, a power-level may be inferred from predistortion coefficients 301.

Predistortion datapath block 312 may include a predistortion coefficient-to-lookup table builder ("LUT builder") 321 and a nonlinear filter 303. LUT builder 321 may be coupled to receive predistortion coefficients 301, as well as optional power-level signal 320, for populating one or more lookup tables ("LUTs") 322 of nonlinear filter 303. Accordingly, predistortion coefficients 301 received by LUT builder 321 may be assigned to a lookup table ("LUT") of at least one LUT 322 for a modulation type and a bandwidth, as well as a power level. Different sets of predistortion coefficients 301 may be stored in LUTs 322 for a same modulation and a same bandwidth but delineated according to power level.

Figure 4:
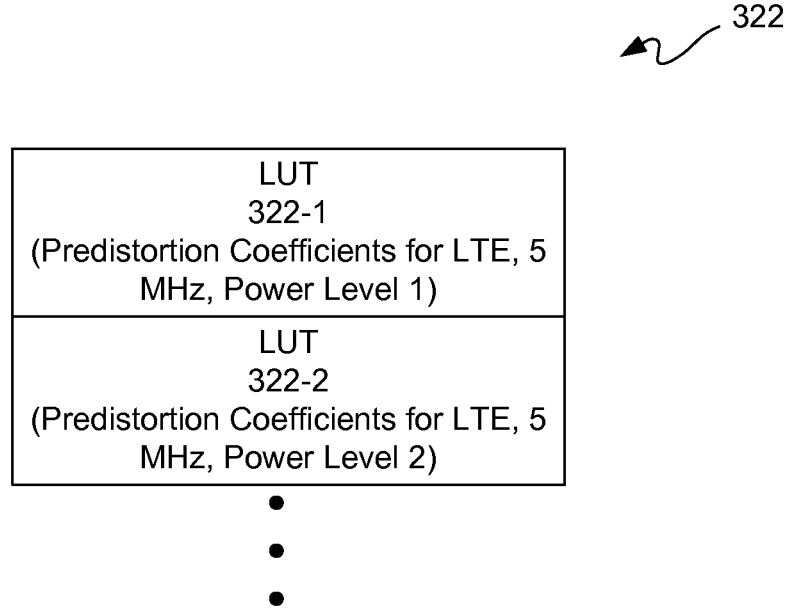
FIG. 4 is a block diagram depicting an exemplary stack of lookup tables.

For example, FIG. 4 is a block diagram depicting an exemplary stack of LUTs 322. Even though only two LUTs 322-1 and 322-2 are illustratively depicted for a same modulation and bandwidth, in other implementations more than two LUTs 322 may be implemented for a variety of combinations of modulations and/or bandwidths, where such LUTs 322 are further segregated according to power-level. In this example, both of LUTs 322-1 and 322-2 are for an LTE 5 MHz bandwidth signal, where LUT 322-1 is for power level 1 and LUT-322-2 is for power level 2. These two power levels may be any two different power levels that may be used for LTE 5 MHz signals.

Along the above lines, at least one LUT 322 may be segregated from at least one other LUT 322 according to power level for a same modulation type and a same bandwidth. At least one LUT 322 may be segregated from at least one other LUT 322 according to modulation type and power level for a same bandwidth. At least one LUT 322 may be segregated from at least one other LUT 322 according to modulation type and bandwidth for a same power level. At least one LUT 322 may be segregated from at least one other LUT 322 according to power level and bandwidth for a same modulation type.

Returning to FIG. 3-2, a LUT 322 of LUTs 322 may be selected, such as by modulation, bandwidth and power level, for storage of predistortion coefficients 301 associated therewith. Nonlinear filter 303 may be coupled to one or more LUTs 322 to receive predistortion coefficients 301 as segregated in such LUTs 322 as filter coefficients. For predistorting an input signal 101 associated with such a bandwidth, modulation, and power level, such a LUT 322 may be accessed to have predistortion coefficients 301 stored therein respectively output to multipliers of nonlinear filter 303 as respective filter coefficients thereof. Nonlinear filter 303 may receive delayed version 105 of input signal 101 for nonlinear filter 303 thereof using such predistortion coefficients 301 of a selected LUT 322 output.

Figure 5:
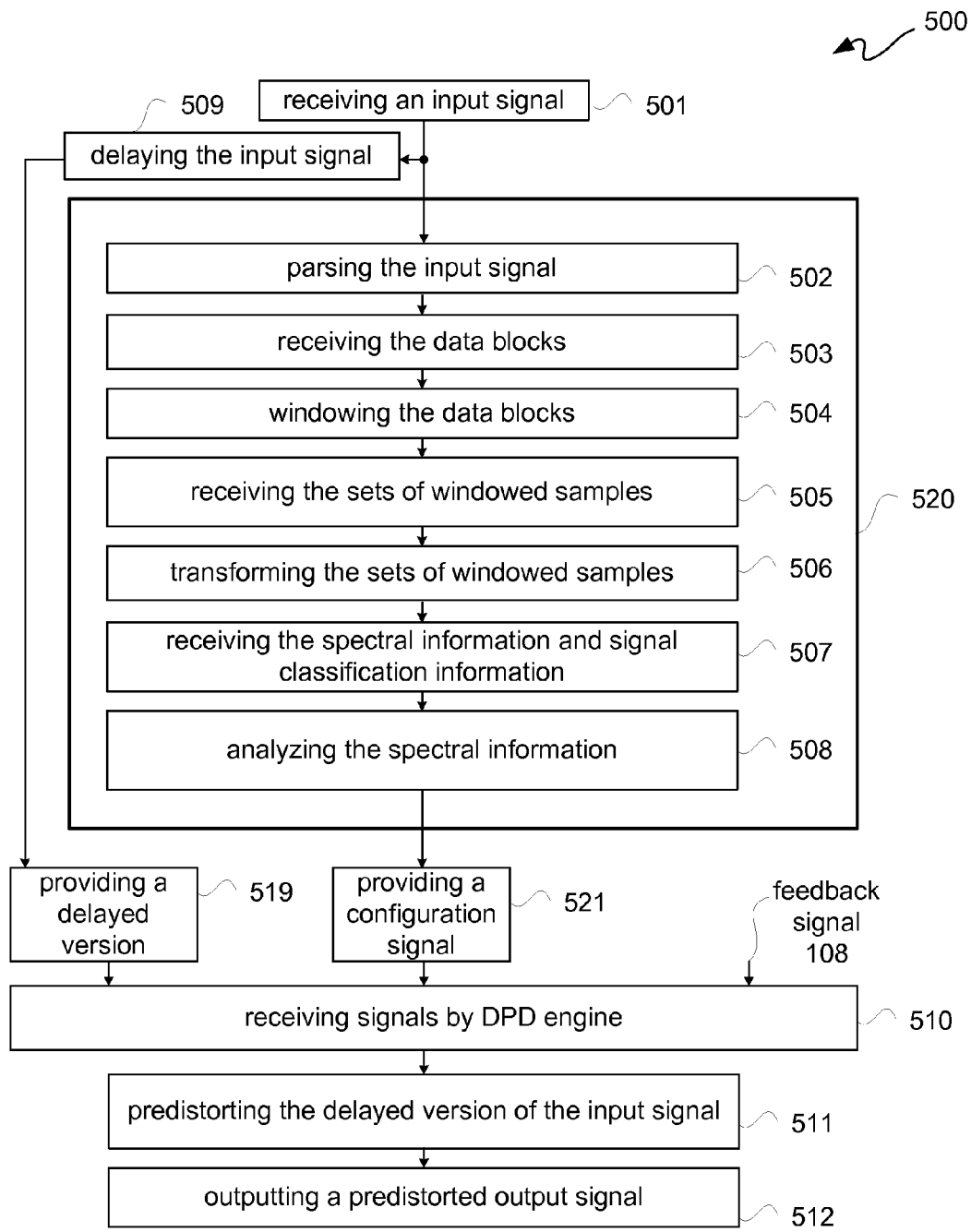
FIG. 5 is a flow diagram depicting an exemplary signal preconditioning flow.

FIG. 5 is a flow diagram depicting an exemplary signal preconditioning flow 500. Signal preconditioning flow 500 is further described with simultaneous reference to FIGS. 1 through 5.

At 501, an input signal 101 may be received by a signal classifier block 110 and a delay block 114. A configuration signal 107 may be provided from signal classifier block 110 for such input signal. Along those lines, operations 502 through 508 may pertain to processing input signal 101 by signal classifier block 110 for providing configuration signal 107. For this example, operations 502 through 508 are an implementation of classifying and generating at 520 for an identified classification of an input signal 101 with signal classifier block 110 for generating a configuration signal by signal classifier block 110, where such configuration signal generated has configuration information for DPD engine parameterization in response to such input signal classification.

With reference to signal classifier block 110, a parser block 111 of signal classifier block 110 may receive input signal 101 at 501. At 502, input signal 101 may be parsed with parser block 111 to provide data blocks 109 from complex data samples obtained from input signal 101. At 503, data blocks 109 may be received by a windowing block 112.

At 504, data blocks 109 may be windowed with windowing block 112 to provide corresponding sets of windowed samples 103 for data blocks 109. At 505, sets of windowed samples 103 may be received by a Fourier Transform block 113.

At 506, sets of windowed samples 103, which may be discrete digital signals in a time domain, may be transformed from a time domain to a frequency domain with Fourier Transform block 113 to provide spectral information 104 for each set of windowed samples 103. At 507, spectral information 104 and signal classification information 106 may be received by a signal analyzer 115.

At 508, spectral information 104 may be analyzed by signal analyzer 115 for classification using signal classification information 106 to provide a configuration signal 107. Signal classification data for input signal 101 may be used by signal analyzer 115 for providing configuration information for configuration signal 107 to enhance operation of power amplifier 220 by compensating for nonlinearity thereof.

At 509, input signal 101 may be delayed with a delay block 114 to provide a delayed version 105 of input signal 101 at 519. Such delayed version 105 may be timed for delay associated with processing input signal 101 for providing configuration signal 107 at 521, namely delayed version 105 and configuration signal 107 may be output at generally the same time from their respective block sources. Configuration signal 107 output from signal classifier block 110 at 521 may include a classification for an input signal 101 as part of such configuration information.

At 510, a delayed version 105 of input signal 101 and a configuration signal 107 may be received by DPD engine 116. Additionally, a feedback signal 108, if present for a then current predistortion cycle, may be received at 510 by DPD engine 116.

At 511, input signal 101, or more particularly a delayed version 105 of input signal 101, may be predistorted to provide a predistorted version of input signal 101 as a predistorted output signal 102, which predistorted output signal 102 may be output from DPD engine 116 at 512. Configuration signal 107 includes configuration information for such delayed version 105 of input signal 101 for DPD engine parameterization for predistorting of delayed version 105 by DPD engine 116. Predistorted output signal 102 output from DPD engine 116 at 512 may be configured for reducing nonlinearity in an analog output 221 of a power amplifier 220 coupled downstream to receive such predistorted output signal 102.

Figure 6:
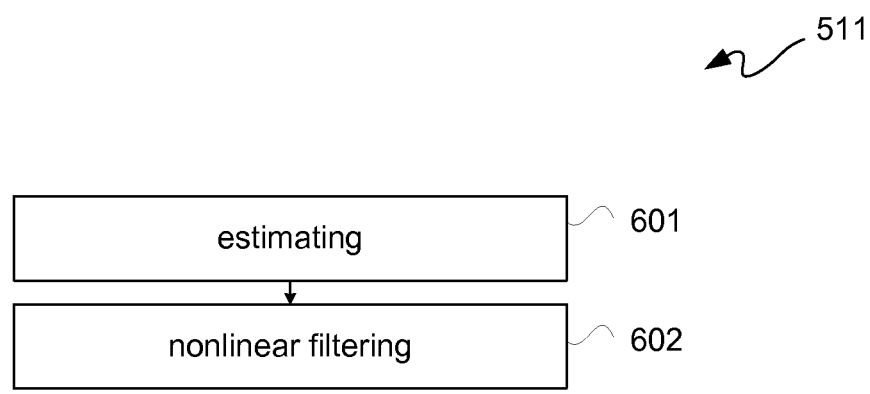
FIG. 6 is a flow diagram depicting exemplary operations for an operation of the signal preconditioning flow of FIG. 5.

Predistorting at operation 511 may include operations at 601 and 602, as illustratively depicted in the flow diagram of FIG. 6 of exemplary operations of estimating and nonlinear filtering, respectively.

At 601, parameters may be estimated using delayed version 105 of input signal 101, configuration signal 107 and, if available, feedback signal 108 to provide predistortion coefficients 301. Parameter estimation engine 311 may be used for such estimating at 601. Again, feedback signal 108 may provide predistortion coefficient adaptation information associated with a power amplifier output 221 to provide feedback for providing predistortion coefficients 301, including without limitation updating for refinement of predistortion coefficients 301.

At 602, delayed version 105 of input signal 101 may be nonlinear filtered using predistortion coefficients 301 for providing predistorted output signal 102. Nonlinear filter 303 may be used for such nonlinear filtering at 602.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 7:
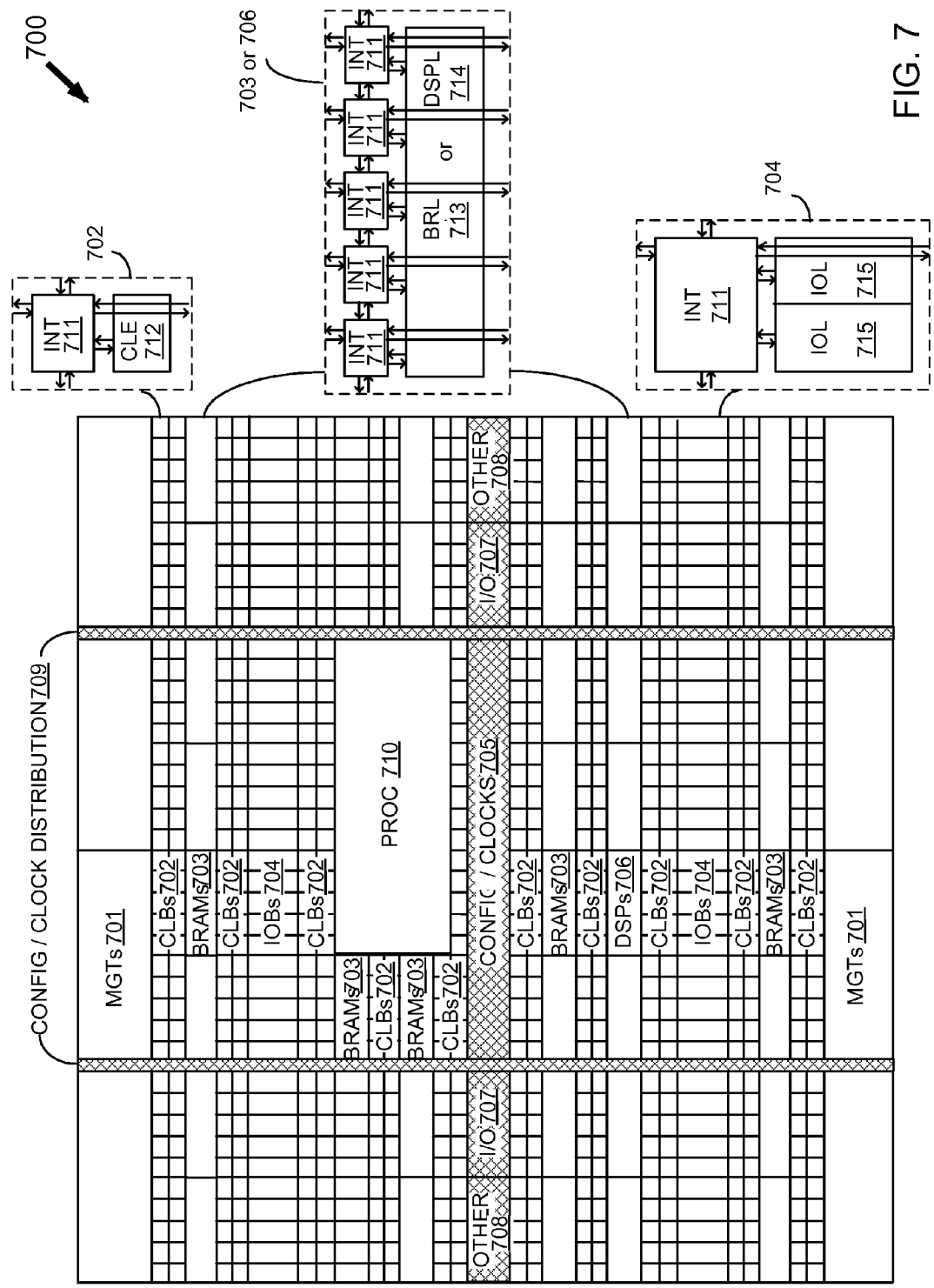
FIG. 7 is a simplified block diagram depicting an exemplary columnar Field Programmable Gate Array ("FPGA") architecture.

As noted above, advanced FPGAs can include several different types of programmable logic blocks in the array. For example, FIG. 7 illustrates an FPGA architecture 700 that includes a large number of different programmable tiles including multi-gigabit transceivers ("MGTs") 701, configurable logic blocks ("CLBs") 702, random access memory blocks ("BRAMs") 703, input/output blocks ("IOBs") 704, configuration and clocking logic ("CONFIG/CLOCKS") 705, digital signal processing blocks ("DSPs") 706, specialized input/output blocks ("I/O") 707 (e.g., configuration ports and clock ports), and other programmable logic 708 such as digital clock managers, analog-to-digital converters, system monitoring logic, and so forth. Some FPGAs also include dedicated processor blocks ("PROC") 710.

In some FPGAs, each programmable tile includes a programmable interconnect element ("INT") 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 can include a configurable logic element ("CLE") 712 that can be programmed to implement user logic plus a single programmable interconnect element ("INT") 711. A BRAM 703 can include a BRAM logic element ("BRL") 713 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element ("DSPL") 714 in addition to an appropriate number of programmable interconnect elements. An IOB 704 can include, for example, two instances of an input/output logic element ("IOL") 715 in addition to one instance of the programmable interconnect element 711. As will be clear to those of skill in the art, the actual I/O pads connected, for example, to the I/O logic element 715 typically are not confined to the area of the input/output logic element 715.

In the pictured embodiment, a horizontal area near the center of the die (shown in FIG. 7) is used for configuration, clock, and other control logic. Vertical columns 709 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 710 spans several columns of CLBs and BRAMs.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for signal preconditioning, comprising:
   a signal classifier block and a delay block commonly coupled for receiving an input signal;
   the delay block for providing a delayed version of the input signal;
   the signal classifier block for classifying the input signal and generating a configuration signal having configuration information for digital predistortion (DPD) engine parameterization in response to the input signal classification; and
   a DPD engine for receiving the delayed version of the input signal and the configuration signal and for providing a predistorted output signal;
   wherein the signal classifier block comprises:
      a Fourier Transform block configured for receiving sets of samples for transforming the sets of samples into a frequency domain for providing spectral information for the sets of samples; and
      a signal analyzer configured for receiving the spectral information and analyzing the spectral information for classification using signal classification information including meta-data for a plurality of different waveforms for providing the configuration signal.

2. The apparatus according to claim 1, wherein the predistorted output signal is used for reducing effects of nonlinearity of a power amplifier coupled downstream of the DPD engine; and wherein the signal classifier block further comprises:
   a parser block for receiving the input signal for providing data blocks from complex data samples obtained from the input signal; and;
   a windowing block for receiving the data blocks for providing sets of windowed samples for the data blocks as the sets of samples;
   wherein the Fourier Transform block is for receiving the sets of windowed samples as the sets of samples for providing the spectral information for the sets of windowed samples.

3. The apparatus according to claim 2, wherein the parser block is a buffer for buffering data of the input signal for outputting the data blocks.

4. The apparatus according to claim 3, wherein the data blocks are overlapping data blocks.

5. The apparatus according to claim 3, wherein the data blocks are non-overlapping data blocks.

6. The apparatus according to claim 2, wherein the spectral information is provided in parallel to the signal analyzer.

7. The apparatus according to claim 2, wherein
   a portion of the meta-data for the input signal used in providing the configuration information enhances operation of the power amplifier by compensating for nonlinearity thereof.

8. The apparatus according to claim 7, wherein the meta-data comprises frequency bandwidth information and modulation information for a plurality of different signal types for the plurality of different waveforms.

9. The apparatus according to claim 7, wherein the meta-data comprises frequency bandwidth information, modulation information, and power-level information for a plurality of different signal types for the plurality of different waveforms.

10. The apparatus according to claim 2, wherein the DPD engine comprises a parameter estimation engine for receiving the delayed version of the input signal, the configuration signal, and a feedback signal for updating of predistortion coefficients.

11. The apparatus according to claim 10, wherein:
    the feedback signal has predistortion coefficient adaptation information;
    the configuration information is for an identified signal type of the input signal for converting the parameter estimation engine into a special-purpose parameter estimation engine for the signal type identified for updating of the predistortion coefficients; and
    the signal type is selected from a group consisting of WCDMA signals, LTE signals, GSM signals, and CDMA200 signals.

12. The apparatus according to claim 10, wherein:
    the DPD engine further comprises a predistortion datapath block for receiving the delayed version of the input signal and the predistortion coefficients; and
    the predistortion datapath block comprises a nonlinear filter coupled for application of the predistortion coefficients as filter coefficients for the nonlinear filter.

13. The apparatus according to claim 10, wherein:
    the DPD engine further comprises a predistortion datapath block for receiving the delayed version of the input signal and the predistortion coefficients; and
    the predistortion datapath block comprises:
       a nonlinear filter; and a predistortion coefficient-to-lookup table builder for receiving the predistortion coefficients and assigning the predistortion coefficients received to a lookup table of the nonlinear filter;

wherein the lookup table of the nonlinear filter is coupled for receiving of the predistortion coefficients as filter coefficients.

14. The apparatus according to claim 13, wherein the lookup table is segregated from at least one other lookup table of the nonlinear filter according to power level for a same modulation type and a same bandwidth as between the lookup table and the at least one other lookup table.

15. The apparatus according to claim 13, wherein the lookup table is segregated from at least one other lookup table of the nonlinear filter according to modulation type and at least one of power level for a same bandwidth or bandwidth for a same power level as between the lookup table and the at least one other lookup table.

16. The apparatus according to claim 13, wherein the lookup table is segregated from at least one other lookup table of the nonlinear filter according to power level and bandwidth for a same modulation type as between the lookup table and the at least one other lookup table.

17. A transmission system comprising the apparatus according to claim 13, the system further comprising:
   a signal conversion front end for receiving the predistorted output signal for providing an analog input;
   the power amplifier for receiving the analog input for power amplifying thereof for providing an analog output; and
   a signal adaptation block for receiving the analog output for providing the feedback signal.

18. A method for signal preconditioning, comprising:
   receiving an input signal by a signal classifier block and a delay block;
   delaying the input signal by the delay block for providing a delayed version thereof;
   classifying the input signal with the signal classifier block;
   generating a configuration signal by the signal classifier block;
   the configuration signal generated having configuration information for digital predistortion (DPD) engine parameterization in response to the input signal classification;
   receiving the delayed version of the input signal and the configuration signal by a DPD engine; and
   predistorting the input signal by the DPD engine for providing a predistorted output signal;

wherein the classifying and the generating by the signal classifier block comprise:
   transforming sets of samples with a Fourier Transform block for transforming the sets of samples into a frequency domain for providing spectral information for the sets of samples;
   receiving the spectral information and signal classification data by a signal analyzer; and
   analyzing the spectral information by the signal analyzer for classification using the signal classification data including meta-data for a plurality of different waveforms for providing the configuration signal.

19. The method according to claim 18, further comprising outputting the predistorted output signal from the DPD engine for reducing nonlinearity in an analog output of a power amplifier coupled downstream to receive the predistorted output signal; and wherein the classifying and the generating by the signal classifier block further comprise:
   parsing the input signal with a parser block for providing data blocks from complex data samples obtained from the input signal;
   receiving the data blocks by a windowing block;
   windowing the data blocks with the windowing block for providing corresponding sets of windowed samples for the data blocks as the sets of samples; and
   receiving the sets of windowed samples by the Fourier Transform block;
   wherein the transforming of the sets of windowed samples with the Fourier Transform block is for providing the spectral information for each set of the sets of windowed samples; and
   wherein the signal classification data for the input signal is used by the signal analyzer for providing the configuration information to enhance operation of the power amplifier by compensating for the nonlinearity thereof.

20. The method according to claim 19, wherein the predistorting comprises:
   estimating parameters using the delayed version of the input signal, the configuration signal and a feedback signal for providing predistortion coefficients; and
   nonlinear filtering the delayed version of the input signal using the predistortion coefficients for providing the predistorted output signal;
   wherein the feedback signal is for providing predistortion coefficient adaptation information associated with the analog output for updating the predistortion coefficients.

* * * * *